(12) United States Patent
Ma et al.

(10) Patent No.: US 8,563,441 B2
(45) Date of Patent: Oct. 22, 2013

(54) METHODS FOR FABRICATING MEMORY CELLS HAVING FIN STRUCTURES WITH SMOOTH SIDEWALLS AND ROUNDED TOP CORNERS AND EDGES

(75) Inventors: Yi Ma, Santa Clara, CA (US); Robert Bertram Ogle, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 378 days.

(21) Appl. No.: 12/111,122

(22) Filed: Apr. 28, 2008

(65) Prior Publication Data

US 2009/0269918 A1 Oct. 29, 2009

(51) Int. Cl.
H01L 21/302 (2006.01)
H01L 21/461 (2006.01)
H01L 21/4763 (2006.01)
H01L 21/311 (2006.01)

(52) U.S. Cl.
USPC .... 438/750; 438/591; 438/694; 257/E21.214; 257/E21.625

(58) Field of Classification Search
USPC .................. 438/591, 690–696, 705, 735, 756
See application file for complete search history.

(56) References Cited

U.S. PATENT DOCUMENTS

| | | | |
|---|---|---|---|
| 6,500,768 B1 * | 12/2002 | Shields et al. | 438/738 |
| 6,524,930 B1 * | 2/2003 | Wasshuber et al. | 438/424 |
| 6,855,990 B2 * | 2/2005 | Yeo et al. | 257/353 |
| 2003/0042531 A1 * | 3/2003 | Lee et al. | 257/315 |
| 2004/0108523 A1 * | 6/2004 | Chen et al. | 257/202 |
| 2005/0191827 A1 * | 9/2005 | Collins et al. | 438/513 |
| 2005/0266640 A1 * | 12/2005 | You et al. | 438/261 |
| 2006/0154438 A1 * | 7/2006 | Kishimoto et al. | 438/424 |
| 2007/0128782 A1 * | 6/2007 | Liu et al. | 438/187 |
| 2007/0284634 A1 * | 12/2007 | Yokoyama et al. | 257/288 |

OTHER PUBLICATIONS

Clawson, A.R., Guide to references on III-V semiconductor etching, 31 Materials Science and Engineering 1-438 (2001).*

* cited by examiner

*Primary Examiner* — Calvin Choi

(57) ABSTRACT

Methods for fabricating a semiconductor FIN structure with smooth sidewalls and rounded top corners and edges is disclosed. A method includes forming a plurality of semiconductor FIN structures. A sacrificial oxide layer is formed on the top surface and the sidewall surfaces of the plurality of semiconductor FIN structures for rounding the corners and edges between the top surfaces and the sidewall surfaces of the plurality of semiconductor FIN structures. The sacrificial oxide layer is removed with a high selectivity oxide etchant. The plurality of semiconductor FIN structures are annealed in a hydrogen environment. A tunnel oxide is formed over the plurality of semiconductor FIN structures.

17 Claims, 10 Drawing Sheets

METHODS FOR FABRICATING MEMORY CELLS HAVING FIN STRUCTURES WITH SMOOTH SIDEWALLS AND ROUNDED TOP CORNERS AND EDGES

FIELD OF THE INVENTION

The present invention relates to the fabrication of memory cells.

BACKGROUND

Consumer electronic products such as televisions, digital cameras, cellular telephones, media content players, etc., help to satisfy consumer demand for basic communications and entertainment services. Data storage components play an important role in the operation of these devices. Data storage devices include RAM, ROM, flash memory products, etc.

An important feature of data storage devices is memory cell density. There are many approaches to increasing the memory cell density of memory arrays. One approach involves reducing the channel length between the source and the drain of transistors associated with memory cells in a memory array. This allows the size of each memory cell to be reduced which in turn facilitates the provision of denser memory arrays. Another approach to increasing memory cell density is embodied in a commercially available flash memory product called MirrorBit™ Technology from Spansion, located in Sunnyvale, Calif.

In flash memory arrays that use MirrorBit technology, the use of MirrorBit memory cells effectively doubles their intrinsic density by storing two physically distinct bits on opposite sides of the memory cells. Each bit that is stored within a cell serves as a binary unit of data (either a logic one or zero) that is mapped directly to the memory array.

An exemplary MirrorBit™ memory device includes a semiconductor substrate with spaced apart source and a drain regions (both typically having N-type conductivity) formed in a substrate. An oxide-nitride-oxide (ONO) layered stack is formed on the top surface of the substrate between the two bit lines. A gate electrode, which typically comprises an N or N+ polysilicon layer, is formed over the ONO stack. The ONO stack includes a first or bottom dielectric layer (often referred to as a bottom tunnel oxide), a charge storing nitride layer, and a second or top dielectric layer of oxide.

Some challenges associated MirrorBit™ devices are related to structural and functional features of the device. For example, it can be difficult to reduce the size or pitch of the cell because the storage element of the above-mentioned flash memory cell can be planar (the oxide, nitride and oxide layers are all horizontal layers formed one on top of the other on the silicon substrate). Moreover, as it regards operations such as the erasure of a Mirrorbit™ cell such as by hot hole injection, because hot holes bombard the interface between the substrate and the bottom tunnel oxide, the interface as well as the bottom tunnel oxide can be damaged causing undesirable interface states and degraded reliability over program/erase cycling.

In order to increase memory density, a FIN structure is desirable in more advanced non-volatile memory technology. However, conventional fabrication methodologies can provide results that can affect the operation of the fabricated MirrorBit™ devices. Problematic features of devices fabricated from conventional methodologies include rough FIN sidewall silicon surfaces, sharp corners and edges in the FIN structure between top surface and sidewalls, non-uniform coverage of the tunnel oxide and early breakdown at the corners and edges due to enhanced electric field.

It should be appreciated that rough sidewall silicon surfaces can result in interface traps. Because of mismatched surface orientations of the silicon FIN sidewalls and the tunnel oxide layer formed over them, interface stresses can result. Importantly, defects can be easily formed at points in the interface where the materials are imperfectly matched. FIG. 1 shows how the formation of the FIN structure can result in damaged sidewall surfaces 101 that include terraces 103 in the sidewalls that are the root cause of high tunnel oxide-silicon interface trap density. Interface traps trap hot electrons that are intended to tunnel through the oxide layer.

In addition, sharp corners and edges of the FIN structure between its top surface and sidewalls can contribute to breakdown at the corners and edges. Referring again to FIG. 1, even though an electric field can be uniformly provided the electric field that results can be concentrated and more intense at the top edges 105 of the FIN structure. As a result, the likelihood of tunnel oxide breakdown at such points is greater. Tunnel oxide breakdown can cause a loss of charge from the charge storage cell structure. As a result, programmed data can be lost.

As can be seen from the above discussion, conventional approaches to fabricating memory cells are inadequate. These approaches can precipitate undesirable consequences that negatively affect device function.

SUMMARY OF THE INVENTION

Methods for fabricating memory cells having FIN structures with smooth sidewalls and rounded top corners and edges is disclosed. A method includes forming a plurality of semiconductor FIN structures. A sacrificial oxide layer is formed on the top surface and the sidewall surfaces of the plurality of semiconductor FIN structures. The sacrificial oxide layer is removed with a high selectivity oxide etchant. The plurality of semiconductor FIN structures is annealed in a hydrogen environment. A tunnel oxide is formed over the plurality of semiconductor FIN structures.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
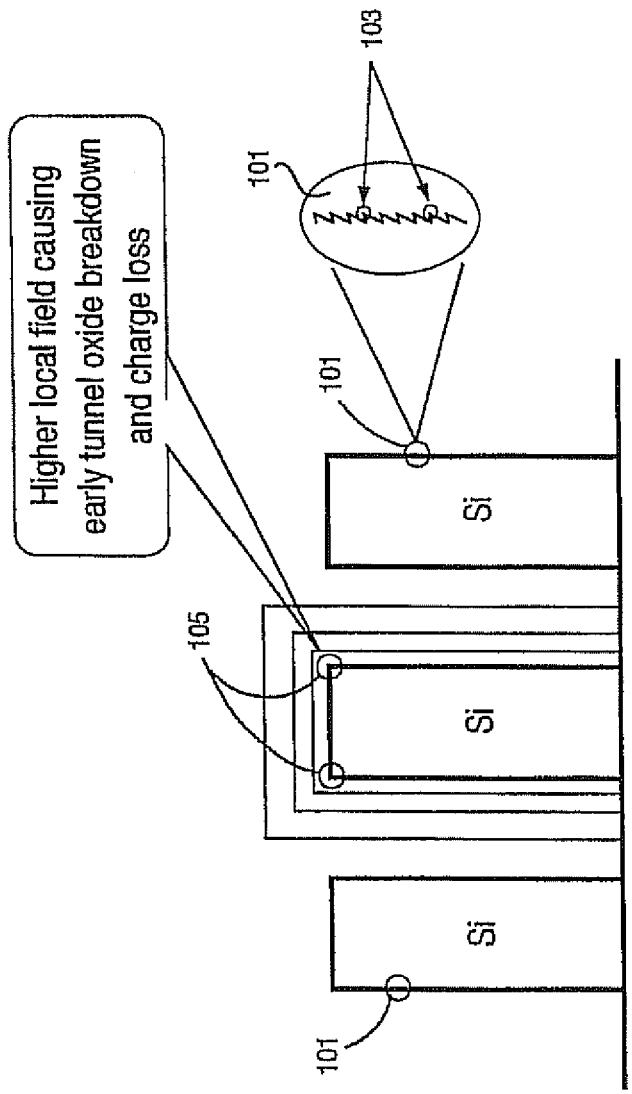
FIG. 1 is a cross section of a plurality of FIN structures used in a conventional memory cell according to the one embodiment of the present invention.
Figure 2A:
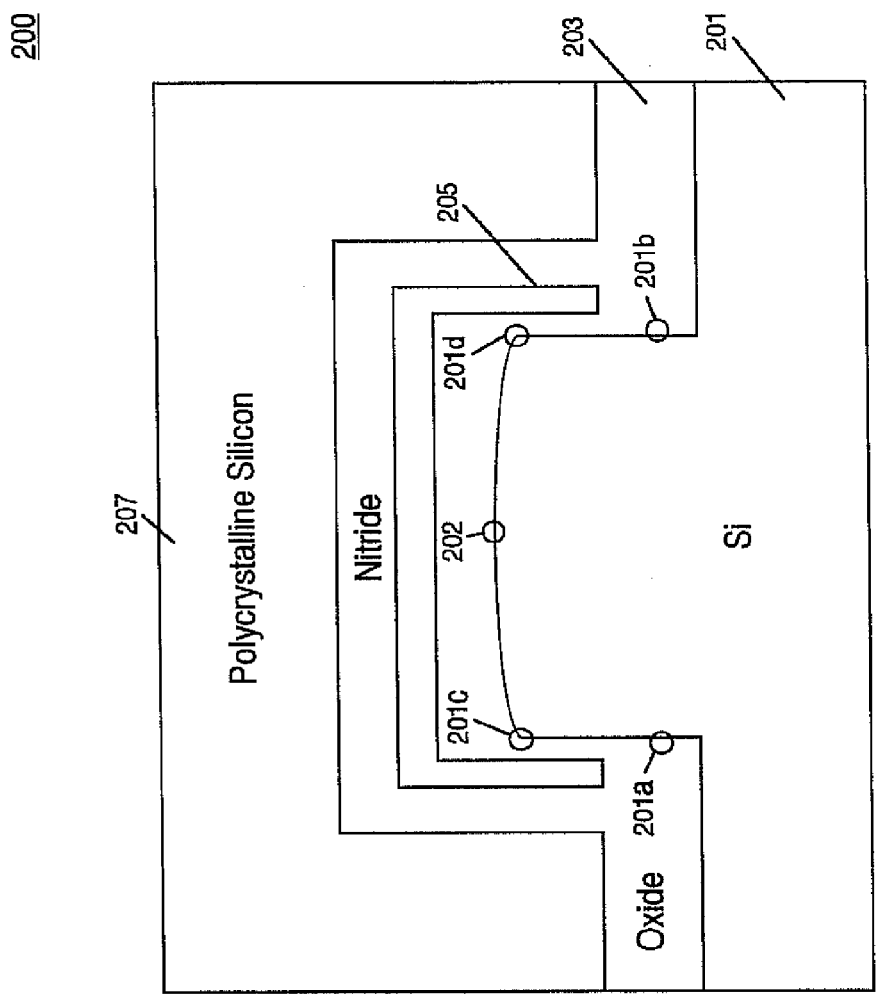
FIG. 2A is a cross section of a memory cell according to the one embodiment of the present invention.

Methods for Fabricating Memory Cells having FIN Structures with Smooth Sidewalls and Rounded Top Corners and Edges FIG. 2A shows a cross section of a memory cell 200 having a FIN structure with smooth sidewalls and rounded top corners and edges according to one embodiment of the invention. In this embodiment, memory cell 200 includes silicon FIN structure 201, nitride charge storage layer 205, oxide layer 203 and polycrystalline layer 207.

Figure 2B:
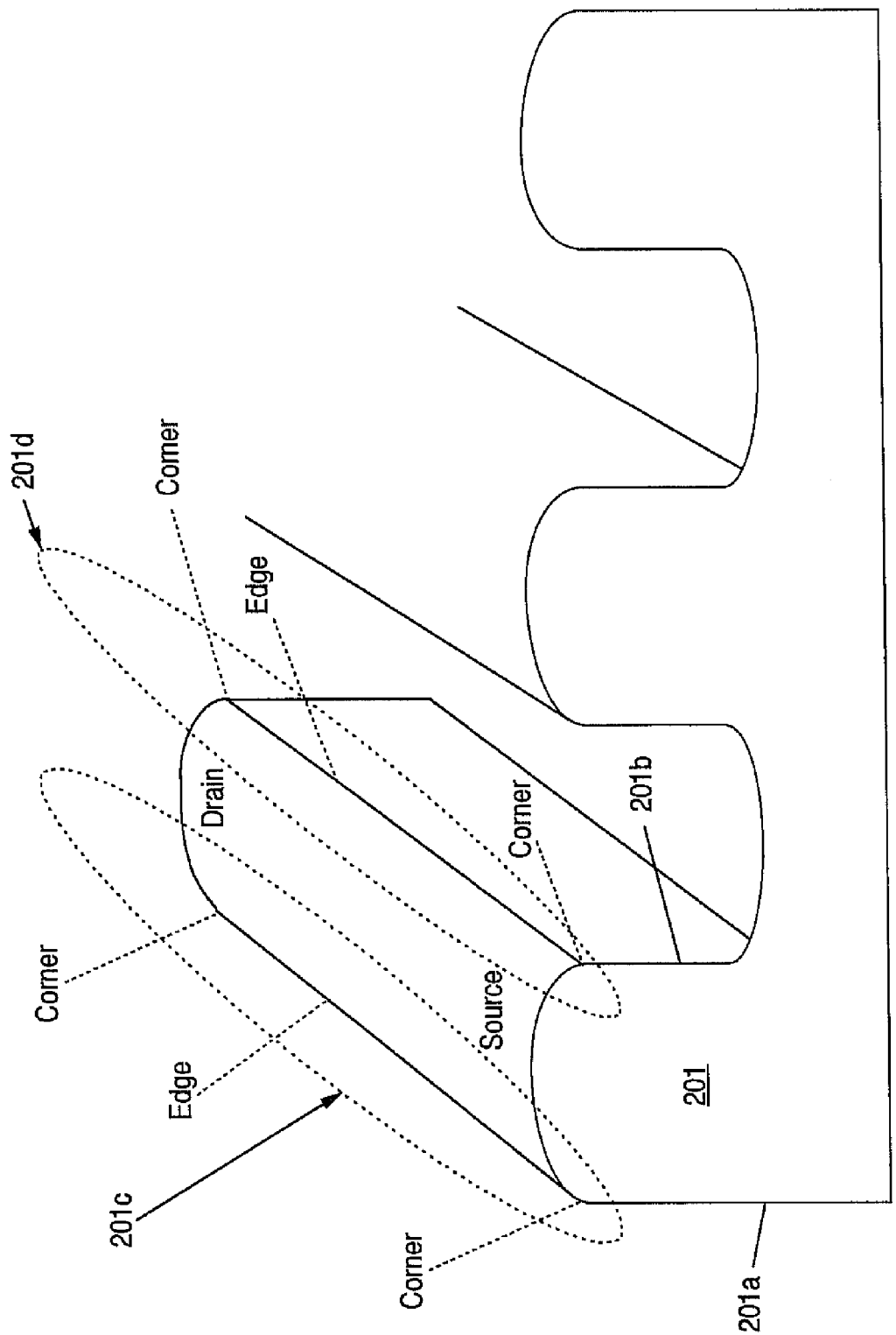
FIG. 2B shows a three-dimensional view of a FIN structure according to one embodiment of the present invention.

Referring to FIG. 2A, memory cell 200 includes a FIN structure 201 that possesses smooth sidewall silicon surfaces 201a and 201b and rounded top corners and edges 201c and 201d between the FIN structure top surface 202 and sidewall surfaces 201a and 201b. Moreover, conformal oxide layer 203 is formed over FIN structure 201. FIG. 2B shows a three-dimensional depiction of the FIN component of memory cell 200 that shows source and drain regions. As shown in FIG. 2B, as used herein the term "top corners" and "edges" is intended to refer to the top corners and edges 201c and 201d of FIN structure 201 in both source and drain regions (see encircled elements). In one embodiment, the rounded top corners and edges serve to provide a memory cell with improved data retention, improved data disturbance immunity and improved memory cell reliability.

In one embodiment, operations discussed in detail herein result in the aforementioned smooth sidewall surfaces 201a and 201b and rounded top corners and edges 201c and 201d between top surface 202 and sidewall surfaces 201a and 201b of FIN structure 201. In one embodiment, smooth sidewall surfaces 201a and 201b are achieved through oxygen radical oxidation, wet oxide deposition and annealing operations described in detail herein. In one embodiment, as is discussed in detail herein a sacrificial oxide is formed and then removed with a high selectivity oxide etchant. In one embodiment, a concentrated hydro-fluoride acid is used to remove the sacrificial oxide. Moreover, in one embodiment, the high selectivity oxide etchant prevents silicon surface roughening. Subsequently, the semiconductor FIN structure 201 is annealed to further smooth its surface. In one embodiment, semiconductor FIN structure 201 is annealed in a hydrogen environment.

In one embodiment, the annealing of the surface of FIN structure 201 reduces the number of surface terraces in the FIN sidewall structure and other imperfections found therein. These operations are discussed in detail herein below.

In one embodiment, the above discussed rounded top corners 201c and 201d are achieved through the use of the aforementioned sacrificial oxide application process that causes a rounding of the top corners and edges of FIN structure 201. Importantly, in one embodiment, the sacrificial oxide application process causes an elimination of the sharp edges that can be a problematic feature of conventional FIN structures. In one embodiment, the sacrificial oxide can be formed by thermal radical oxidation (e.g., steam oxidation) in a thermal furnace. In another embodiment, the sacrificial oxide can be formed by oxygen radical oxidation in a single wafer chamber. In one embodiment, higher temperature and pressure in the oxygen radical oxidation process are used to enhance top corner and edge rounding.

In one embodiment, scaling is facilitated because of reduced breakdown of oxide at the top corners and edges of the FIN structure and trapping of charge at points in the interface between the FIN structure and the tunnel oxide layer that can be aggravated as the size of FIN devices are made smaller.

Figure 3:
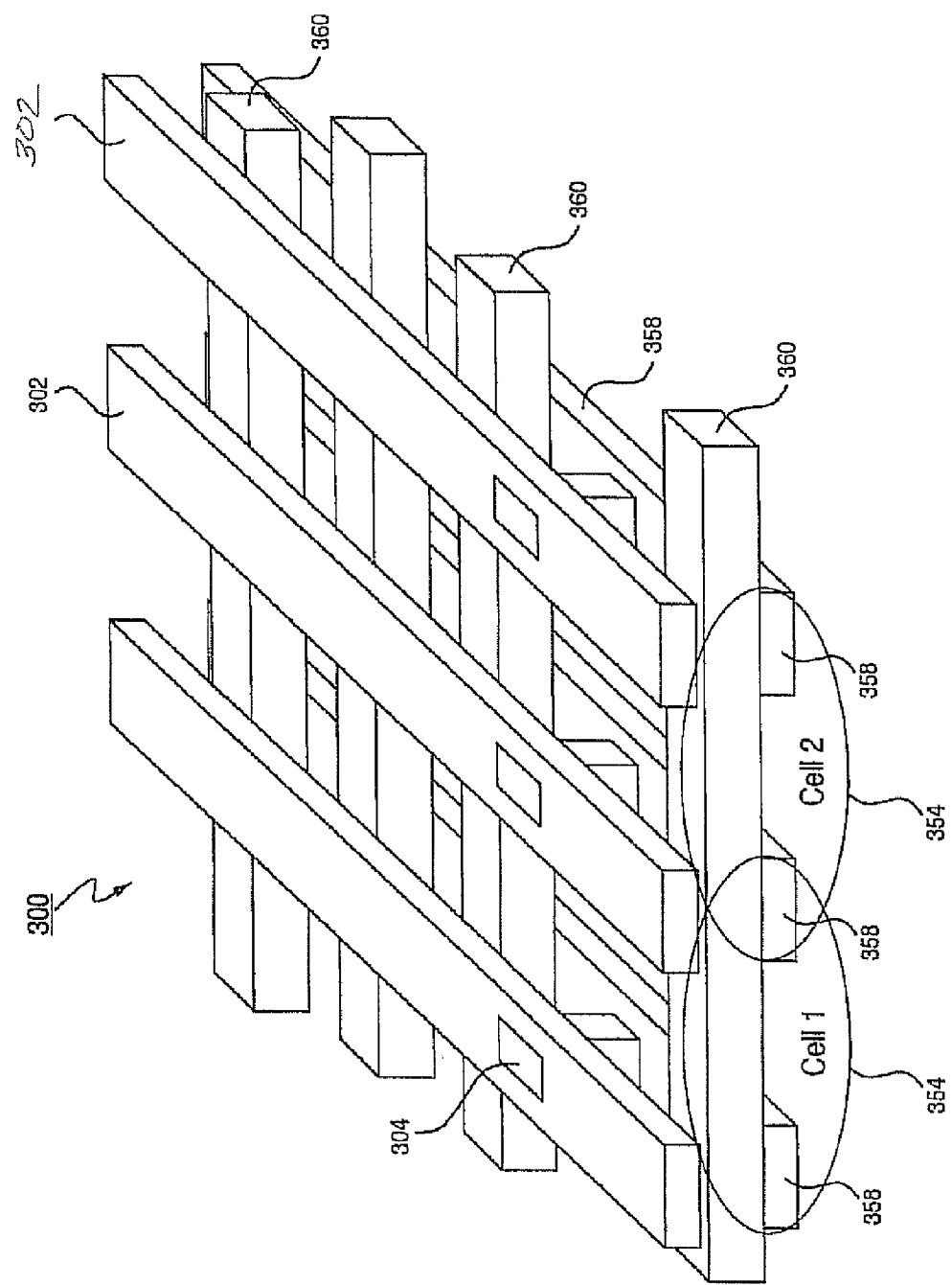
FIG. 3 shows an array architecture that employs memory cells such as described with reference to FIG. 2A according to the one embodiment of the present invention.

FIG. 3 shows an array architecture 300 that employs memory cells such as are described with reference to FIG. 2A. Array 300 includes a plurality of the word lines 360 running in one direction and a plurality of overlying metal interconnects 302 running in the perpendicular direction. The metal interconnects 302 deliver a voltage to the underlying source/drain regions 358 through metal interconnects 304. FIG. 3 also shows two adjacent cells 354 labeled "cell 1" and "cell 2" in FIG. 3. The two cells 354 share a common source/drain region 358. Operations in the process by which the cells are fabricated are described below.

Process Flow for Forming Memory Cells Having FIN Structures with Smooth Sidewalls and Rounded Top Corners and Edges FIGS. 4A-4E show a series of cross sections illustrating the process flow involved in forming memory cells having FIN structures 401a-401c with smooth sidewalls 403a and 403b and rounded top corners and edges 405a and 405b according to one embodiment of the invention is shown.

Figure 4A:
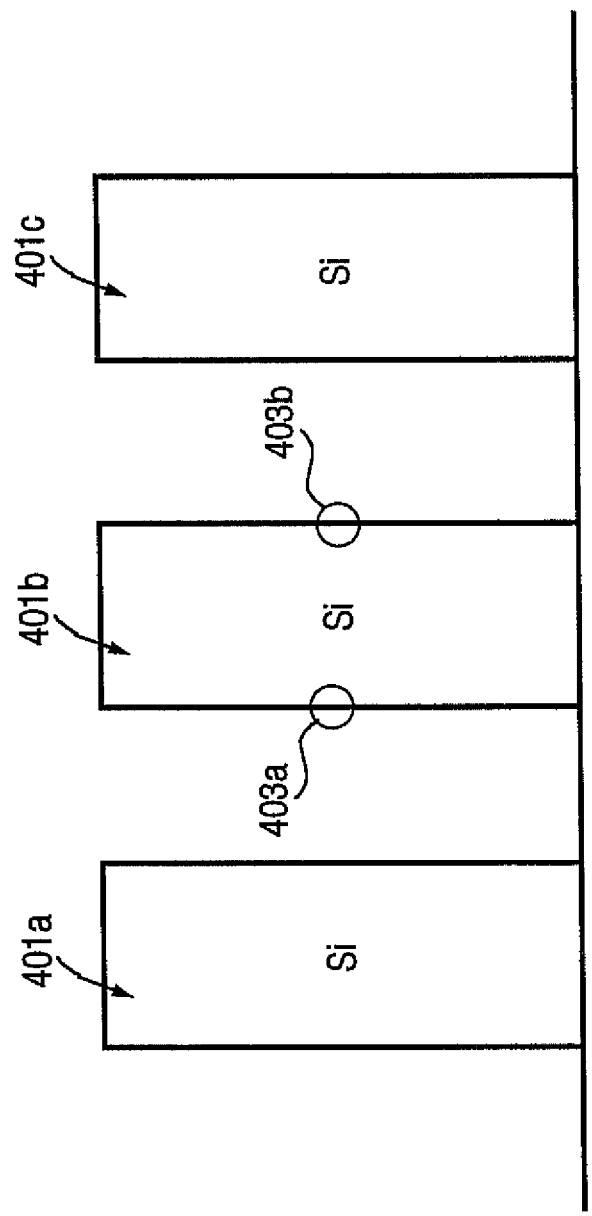
FIG. 4A shows a resultant cross sectional view subsequent to one or more operations in a process for forming a memory cell according to one embodiment of the present invention.

As shown in FIG. 4A, in an initial operation a plurality of FIN structures 401a-401c are formed in a substrate wafer.

Figure 4B:
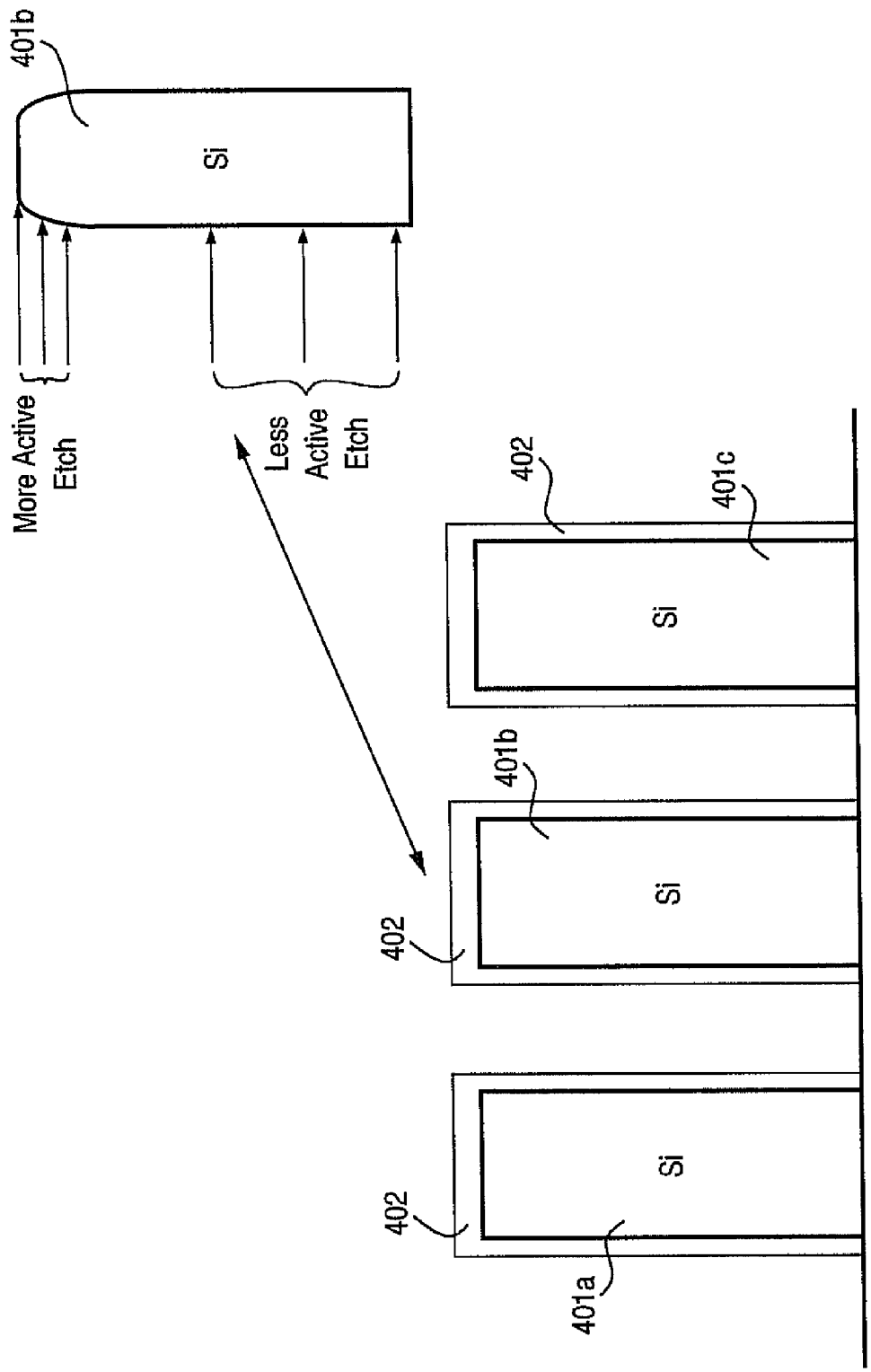
FIG. 4B shows a resultant cross sectional view subsequent to one or more operations in a process for forming a memory cell according to one embodiment of the present invention.

As shown in FIG. 4B, subsequent to one or more operations that result in the plurality of FIN structures, 401a-401c, shown in FIG. 4A, a sacrificial oxide 402 is formed on FIN structures 401a-401c. In one embodiment, sacrificial oxide 402 can be formed by thermal radical oxidation (e.g., a type of oxygen radical oxidation) in a thermal furnace. In another embodiment, sacrificial oxide 402 can be formed by plasma radical oxidation (e.g., a type of oxygen radical oxidation) in a single wafer chamber. In one embodiment, higher temperature and pressure in the plasma process can be used to enhance top corner and edge rounding. In one embodiment, sacrificial oxide 402 is applied in a manner that causes a rounding of the top corners and edges of the FIN structure. In particular, in one embodiment, sacrificial oxide 402 is applied such that sacrificial oxide 402 that is formed over the corners of the FIN structure is tuned, such as through the adjustment of pressure and temperature, to etch more actively than that which is applied along the FIN sidewall surfaces, as is illustrated by the representation of the etched FIN structure 401b shown at the upper right side of FIG. 4B. Importantly, this process provides a first level of FIN surface smoothing that acts to eliminate the sharp corners edges that can promote oxide breakdown.

In one embodiment, the plasma process discussed herein can involve the use of both continuous and pulsed plasma. In one embodiment, the plasma process uses 1 W to 5000 W plasma power, at 1 mTorr to 760 Torr, with an oxygen flow rate of 1 sccm (standard cubic centimeter per minute) to 20 slm (standard cubic liter per minute), and N2 flow rate of 1 sccm (standard cubic centimeter per minute) to 20 slm (standard cubic liter per minute). In one embodiment, the thermal process uses 50-1300 C thermal temperature, at 1 Torr to 760 Torr with a hydrogen percent in N2 equal to 1 to 33 percent.

Figure 4C:
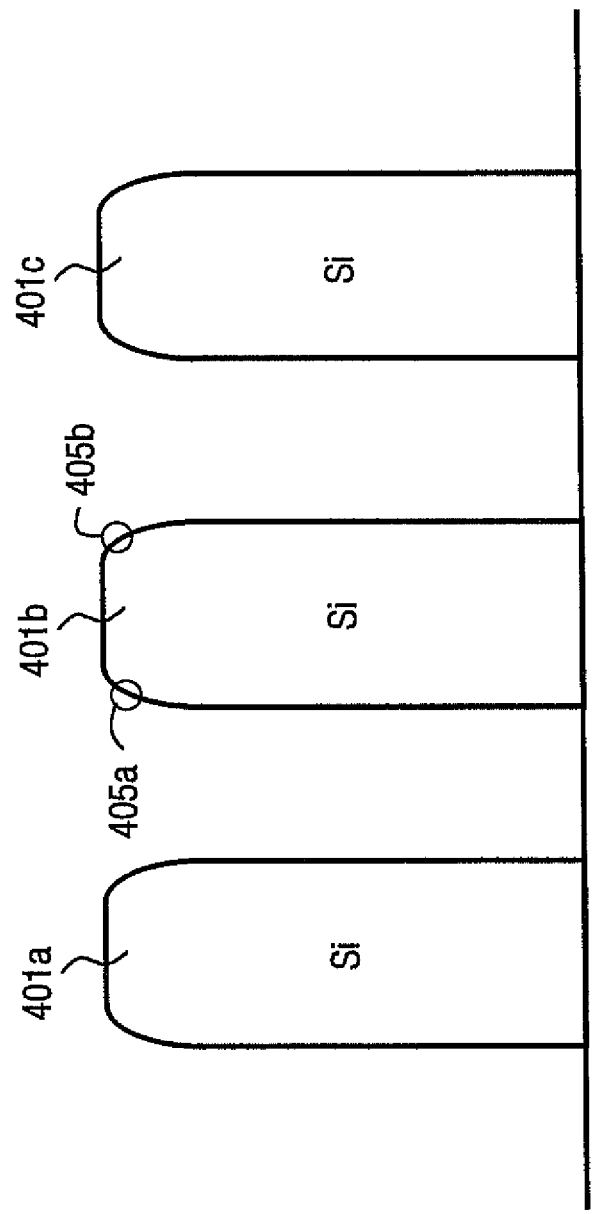
FIG. 4C shows a resultant cross sectional view subsequent to one or more operations in a process for forming a memory cell according to one embodiment of the present invention.

As shown FIG. 4C, subsequent to one or more operations that result in the cross section shown in FIG. 4B, the sacrificial oxide is removed with a high selectivity oxide etchant to expose FIN structures 401a-401c having rounded top corners and edges 405a and 405b. In one embodiment, a concentrated hydro-fluoride acid is used to remove the sacrificial oxide shown in FIG. 4B. In one embodiment, the high selectivity oxide etchant is designed to aggressively etch the sacrificial oxide and to forego the etching of the silicon material from which FIN structure 401 is formed so as to prevent the roughening of the silicon surfaces of FIN structure 401. In one embodiment, a 49 percent solution of hydro-fluoride acid can be used as the oxide etchant. In other embodiments, other solutions may be used.

Figure 4D:
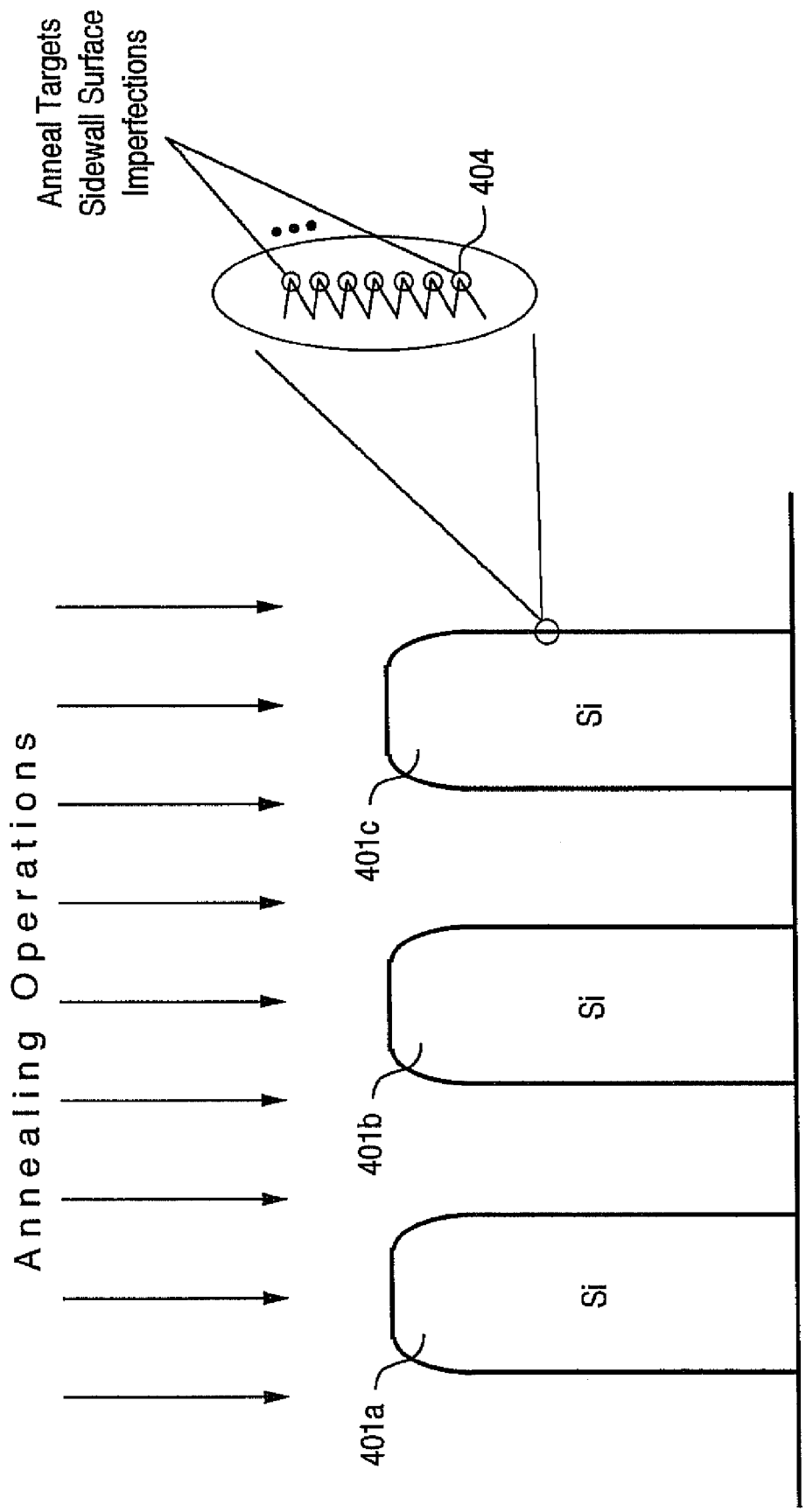
FIG. 4D shows a resultant cross sectional view subsequent to one or more operations in a process for forming a memory cell according to one embodiment of the present invention.

As shown in FIG. 4D, subsequent to the execution of one or more operations that result in the cross section shown in FIG. 4C, the semiconductor FIN structures 401a-401c are annealed to provide further smoothing of the surface of the FIN structures (in addition to the smoothing provided by the operations described with reference to FIG. 4B). In one embodiment, FIN structures 401a-401c are annealed in a hydrogen environment. In one embodiment, the annealing of the surfaces of FIN structures 401a-401c provides a fine tuned smoothing of the surfaces of FIN structures 401a-401c which targets FIN sidewall surface imperfections 404 such as terraces as is shown at right in FIG. 4D (as contrasted with the general smoothing provided by the operations described with reference to FIG. 4B). 7. In one embodiment, a hydrogen anneal at a temperature of 600-1000 C at a pressure of 1 mTorr to 760 Torr using a hydrogen flow rate of 1 sccm to 10 slm for a period of time of 1 second to 1 hour is performed. In other embodiments, other temperatures, pressures, hydrogen flow rates and times can be used.

Figure 4E:
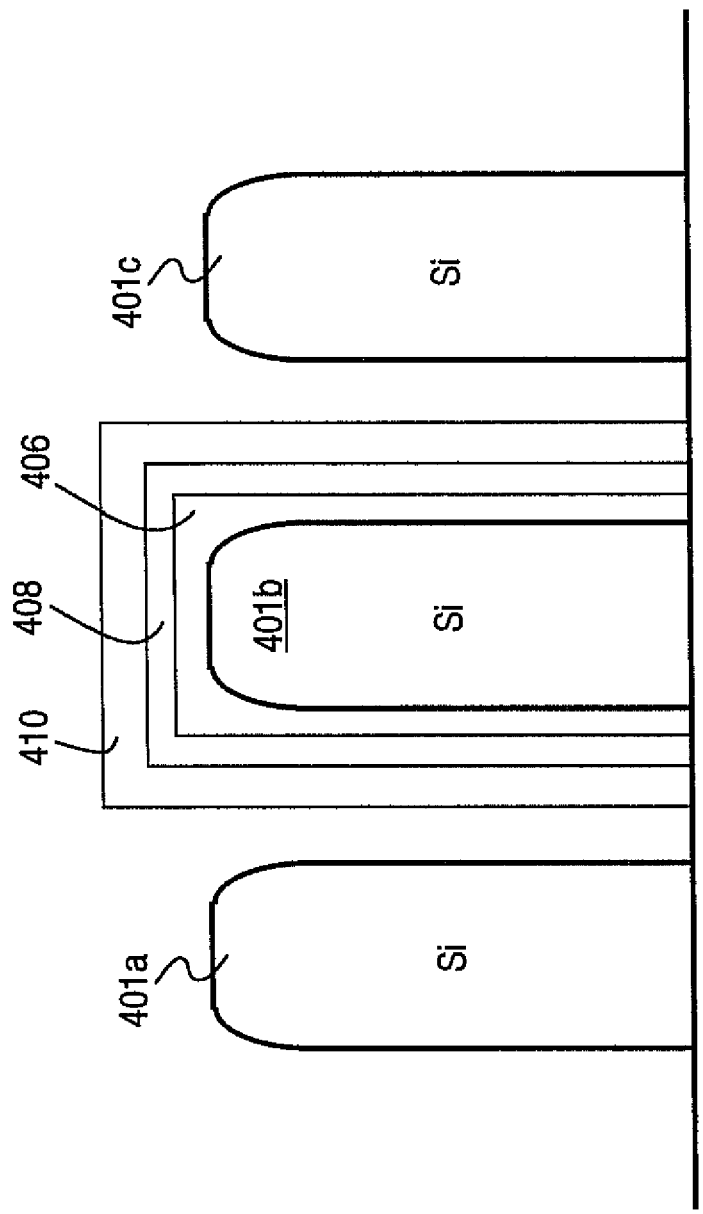
FIG. 4E shows a resultant cross sectional view subsequent to one or more operations in a process for forming a memory cell according to one embodiment of the present invention.

As shown in FIG. 4E, subsequent to the execution of one or more operations that result in the cross section shown in FIG. 4D, a tunnel oxide 406 is formed over FIN structures 401a-401c, a nitride charge trapping layer 408 is formed over the tunnel oxide and a top oxide 410 is formed over the nitride layer (shown only over 401b in FIG. 4E for clarity). Thereafter, typical SONOS steps can be performed.

EXEMPLARY ADVANTAGES

Low Interface Trap Density

In one embodiment, a FIN charge cell structure that possesses a low interface trap density is provided. In conventional FIN charge cell structures, interface traps can develop at the interface of the FIN structure (e.g., 201 in FIG. 2A) and the tunnel oxide layer (e.g., 203 in FIG. 2A) of the FIN charge cell structure that trap hot electrons that are intended to tunnel through the tunnel oxide layer. The charge bottleneck can cause the speed of the device to be slowed as a programming of the device requires the charge trap to be filled before the charge storage space is filled to effect programming. In contrast, to erase the charge from the charge cell structure, the charge trap must be emptied before the substrate is emptied to effect erasure. It is important to note that the reading of memory storage cells can involve the detection of a threshold voltage. For example, in one embodiment, a high threshold voltage reading can indicate that a memory cell is programmed and a low threshold voltage reading can indicate that the memory cell is erased. However, because charge that is trapped in interface traps can cause a threshold voltage Vth to remain until the trapped charge is emptied, even when the charge in a memory storage cell has been emptied during the erasure process, a "programmed" reading may continue to be indicated. In one embodiment, the herein described operations result in a smoothing of sidewall surfaces of FIN structures which enables the provision of FIN charge cell structures that possess low interface trap density (see discussion below).

Smooth FIN Sidewall Surfaces

In one embodiment, smooth sidewall silicon surfaces in FIN charge storage structures are provided. Because of the surface orientation (110) of the silicon FIN sidewalls (e.g., 201a and 201b in FIG. 2A), the silicon FIN sidewalls and the material used to form the tunnel oxide (e.g., 203 in FIG. 2A) can be imperfectly matched at the atomic level and may not form perfect bonds. The resultant imperfections that form in the interface between the FIN sidewalls and the tunnel oxide can cause stress in the interface between the FIN sidewalls and the tunnel oxide. Importantly, defects can be easily formed at points in the interface where the materials are imperfectly matched. Consequently, interface traps can be formed that trap charge (e.g., hot electrons) that is intended to tunnel through the oxide layer.

In one embodiment, the operations discussed above with reference to FIGS. 4A-4E result in smooth FIN sidewall silicon surfaces. In one embodiment, the application of the sacrificial oxide (see FIG. 4B) provides general smoothing and shaping of the FIN sidewall surfaces while the annealing step (see FIG. 4D) provides fine tuned smoothing that smoothes microscopic sidewall surface imperfections that may be present in the FIN sidewalls. Accordingly, the processes embodied in exemplary embodiments provide multiple levels of smoothing that result in optimally smooth FIN sidewall surfaces. The smooth FIN sidewall surfaces promote a reduction in the formation of defects in the interface between the FIN sidewall surfaces (e.g., 201a and 201b in FIG. 2A) and the tunnel oxide (e.g., 203 in FIG. 2A) that can lead to the formation of interface traps.

Rounded Top Corners and Edges in FIN Structure Between Top Surface and Sidewall

In one embodiment, a FIN charge storage cell structure that features rounded top corners and edges of the FIN structure (201c and 201d in FIG. 2A) is provided. Even though an electric field may be uniformly provided to the FIN structure of a transistor formed conventionally during normal operation of the transistor, the electric field that results can be concentrated or more intense at sharp top corners and edges of the FIN structure. As a result the likelihood of breakdown at such points is greater. Breakdown can cause a loss of charge for the charge storage cell structure. As a result, programmed data stored therein can be lost.

In one embodiment, as discussed above with reference to FIG. 4B, the sacrificial oxide is applied in a manner that causes a rounding of the top corners and edges of the FIN structure. In one embodiment, the sacrificial oxide is applied such that the sacrificial oxide that is formed over the corners of the FIN structure is tuned, such as through adjustments to pressure and temperature, to etch more actively than that which is applied along the FIN sidewall surfaces. Importantly, this process eliminates the sharp top corners and edges that can promote breakdown.

In one embodiment, again as discussed above with reference to FIG. 4B, the sacrificial oxide can be formed with steam oxidation in a thermal furnace. In another embodiment, the sacrificial oxide can be formed by plasma radical oxidation in a single wafer chamber. In one embodiment, through tuning, the higher temperature and pressure in the plasma radical oxidation process can be used to enhance rounding of the top corners and edges of the FIN structure.

Resistant to Breakdown at Top Corners and Edges

In one embodiment, a FIN charge cell structure (e.g., 200 in FIG. 2A) that is resistant to breakdown at the top corners and edges (e.g., 201c and 201d in FIG. 2A) of the associated FIN structure is provided. Because early breakdown at such top corners and edges can be caused by the enhanced intensity and concentration of an applied electric field as discussed above, device operation can be degraded. In one embodiment, the above discussed rounding of the top corners and edges of the FIN structure can provide the device with a robust resistance to breakdown at top corners and edges of the FIN structure.

Uniform Tunnel Oxide Coverage

In one embodiment, because of the operations described herein that result in rounded FIN top corners and edges, uniform tunnel oxide coverage is facilitated. As a result the likelihood of breakdown at such points is further reduced.

Figure 5:
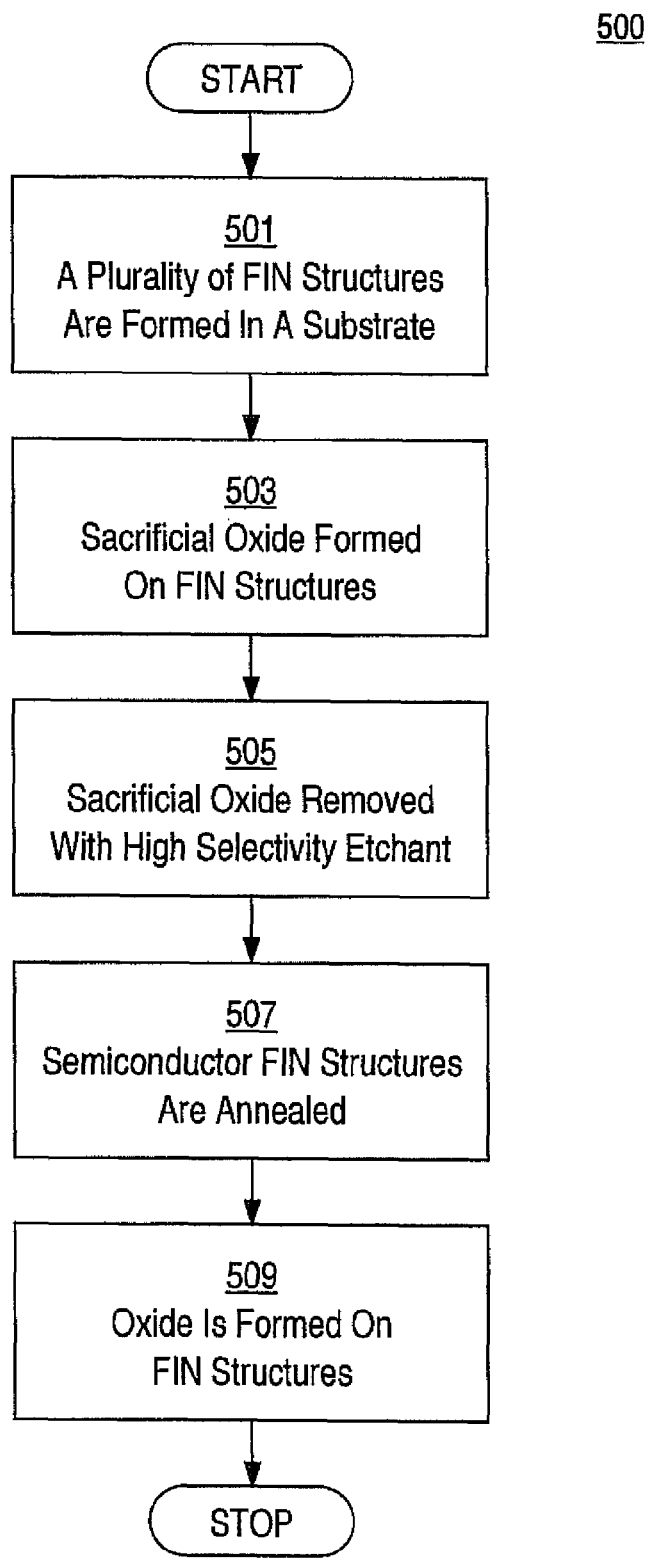
FIG. 5 shows a flowchart of the steps performed in a method for forming memory cells having FIN structures with smooth sidewalls and rounded top corners and edges according to one embodiment.

Exemplary Operations for Fabricating Memory Cells Having Fin Structures with Smooth Sidewalls and Rounded Top Corners and Edges FIG. 5 shows a flowchart 500 of the steps performed in a method for fabricating memory cells having FIN structures with smooth sidewalls and rounded top corners and edges as is described herein according to one embodiment. In one embodiment, the fabrication of the memory cells can be a part of a larger process for fabricating a memory cell array. Although specific steps are disclosed in the flowcharts, such steps are exemplary. That is the present invention is well suited to performing various other steps or variations of the steps recited in the flowcharts.

Referring to FIG. 5, at 501 in an initial operation a plurality of FIN structures are formed in a substrate wafer.

At 503, a sacrificial oxide is formed over the plurality of FIN structures. In one embodiment, the sacrificial oxide can be formed with thermal radical oxidation (e.g., steam oxidation) in a thermal furnace. In another embodiment, the sacrificial oxide can be formed by plasma radical oxidation in a single wafer chamber. In one embodiment, higher temperature and pressure in the plasma radical oxidation process can be used to enhance top corner and edge rounding.

At 505, the sacrificial oxide is removed with a high selectivity oxide etchant. In one embodiment, a concentrated hydro-fluoride acid is used to remove the sacrificial oxide. In one embodiment, the high selectivity oxide etchant prevents silicon surface roughening.

At 507, the semiconductor FIN structures are annealed to further smooth the surface of the FIN structures. In one embodiment, the semiconductor FIN structures are annealed in a hydrogen environment. In one embodiment, the annealing of the surfaces of the FIN structures reduces the number of surface terraces and other imperfections that are formed on the FIN (especially sidewall) surface.

At 509, a tunnel oxide is formed over the FIN structures. In one embodiment, subsequent to step 509 typical SONOS steps can be performed.

With reference to exemplary embodiments thereof, methods for fabricating memory cells having FIN structures with smooth sidewalls and rounded top corner and edges is disclosed. A method includes forming a plurality of semiconductor FIN structures. A sacrificial oxide layer is formed on the top surface and the sidewall surfaces of the plurality of semiconductor FIN structures. The sacrificial oxide layer is removed with a high selectivity oxide etchant. The plurality of semiconductor FIN structures is annealed in a hydrogen environment. A tunnel oxide is formed over the plurality of semiconductor FIN structures.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method for forming a semiconductor FIN structure with rounded top corners and edges, comprising:
   forming a plurality of semiconductor FIN structures wherein said plurality of semiconductor FIN structures include a top surface and sidewall surfaces;
   forming a sacrificial oxide layer on said top surface and said sidewall surfaces of said plurality of semiconductor FIN structures wherein said forming a sacrificial oxide layer comprises varying the etch energy of the sacrificial oxide based on temperature and pressure to be greatest at the corner and edges adjacent said top surface and to decrease along said sidewall surfaces from top to bottom to cause a rounding of the corners and edges between said top surface and said sidewall surfaces of said FIN structure free of additional operations;
   removing said sacrificial oxide layer with a high selectivity oxide etchant;
   annealing the plurality of semiconductor FIN structures in a hydrogen environment; and
   forming a tunnel oxide on said plurality of semiconductor FIN structures.

2. The method of claim 1 wherein said forming said sacrificial oxide layer is performed using a process selected from the group that consists of plasma radical oxidation and thermal radical oxidation.

3. The method of claim 2 wherein said plasma radical oxidation is performed at a power of 1 w to 5000 w, a pressure of 1 mTorr to 760 Torr, with oxygen flow rate of 1 sccm to 20 slm and N2 flow rate of 1 sccm to 20 slm.

4. The method of claim 1 wherein said thermal radical oxidation is performed at temperature 50 to 13000 C and pressure 1 Torr to 760 Torr with hydrogen percent in N2 of 1 percent to 33 percent.

5. The method of claim 1 wherein said removing said sacrificial oxide layer with a high selectivity oxide etchant comprises using a concentrated hydro-fluoride acid that comprises 49% volume HF in H2O.

6. The method of claim 1 wherein said annealing comprises performing a hydrogen anneal at a temperature of 600-1000 C at a pressure of 1 mTorr to 760 Torr using a hydrogen flow rate of 1 sccm to 10 slm for a period of time of 1 second to 1 hour.

7. A method for forming a storage element, comprising:
forming a FIN structure on a semiconductor substrate wherein said forming said FIN structure comprises:
forming a sacrificial oxide layer on a top surface and sidewall surfaces of said FIN structure using oxygen radical oxidation wherein said forming a sacrificial oxide layer comprises varying the etch energy of the sacrificial oxide based on temperature and pressure to be greatest at the corner and edges adjacent said top surface and to decrease along said sidewall surfaces from top to bottom to cause a rounding of the corners and edges between said top surface and said sidewall surfaces of said FIN structure free of additional operations;
removing said sacrificial oxide layer with a high selectivity oxide etchant; and
annealing said FIN structure in a hydrogen environment;
forming a first oxide layer on said FIN structure;
forming a charge storage layer on said first oxide layer;
forming a second oxide layer on the charge storage layer; and
forming a polysilicon gate layer on said second oxide layer.

8. The method of claim 7, wherein the charge storage layer is a high K material comprising one of the following: nitride, $S_1N_4$, polysilicon, or a silicon rich nitride.

9. The method of claim 7, wherein said charge storage layer comprises a first storage element formed adjacent a first sidewall of said FIN structure and a second storage element formed adjacent a second sidewall of said FIN structure.

10. The method of claim 7 wherein said FIN structure is associated with an individual charge storage cell.

11. The method of claim 7 wherein said forming said sacrificial oxide layer is performed using a process selected from the group that consists of plasma radical oxidation and thermal radical oxidation.

12. The method of claim 7 wherein said forming said sacrificial oxide layer is performed using a device that is selected from the group that comprises an in situ steam generation single wafer chamber and a thermal furnace.

13. The method of claim 7 wherein said removing said sacrificial oxide layer with a high selectivity oxide etchant comprises using a concentrated hydro-fluoride acid that comprises 49% volume HF in H2O.

14. The method of claim 7 wherein said annealing comprises performing a hydrogen anneal at a temperature of 600 to 1000 C, a pressure of 1 mTorr to 760 Torr, and using a hydrogen flow rate of 1 sccm to 10 slm for a period of time of 1 second to 1 hour.

15. A method for forming a memory array comprising:
forming a semiconductor substrate; and
forming a plurality of storage elements on said semiconductor substrate, comprising:
forming a plurality of semiconductor FIN structures on a semiconductor substrate wherein said forming said plurality of FIN structures comprises:
forming a sacrificial oxide layer on a top surface and sidewall surfaces of said plurality of semiconductor FIN structures using steam oxidation wherein said forming a sacrificial oxide layer comprises varying the etch energy of the sacrificial oxide based on temperature and pressure to be greatest at the corner and edges adjacent said top surface and to decrease along said sidewall surfaces from top to bottom to cause a rounding of the corners and edges between said top surface and said sidewall surfaces of said FIN structure free of additional operations;
removing said sacrificial oxide layer with a high selectivity oxide etchant; and
annealing said plurality of semiconductor FIN structures in a hydrogen environment;
forming a first oxide layer on said FIN structures;
forming a charge storage layer on said first oxide layer; and
forming a second oxide layer on the charge storage layer.

16. The method of claim 15 wherein said annealing comprises performing a hydrogen anneal at a temperature of 600 to 1000 C at a pressure of 1 mTorr to 760 Torr using a hydrogen flow rate in the range 1 sccm to 10 slm for a period of time in the range 1 second to 1 hour.

17. The method of claim 15 wherein said removing said sacrificial oxide layer with a high selectivity oxide etchant comprises using a concentrated hydro-fluoride acid that comprises 49% volume HF in H2O.

* * * * *